(12) United States Patent
Arkas et al.

(10) Patent No.: US 6,897,686 B2
(45) Date of Patent: May 24, 2005

(54) PULSE PEAK AND/OR TROUGH DETECTOR

(75) Inventors: Evangelos Arkas, London (GB);
Nicholas Arkas, London (GB)

(73) Assignee: Diadalos, Inc, Tortola (VG)

( * ) Notice: Subject to any disclaimer, the term of this patent is extended or adjusted under 35 U.S.C. 154(b) by 0 days.

(21) Appl. No.: 10/770,148

(22) Filed: Feb. 2, 2004

(65) Prior Publication Data

US 2004/0169528 A1 Sep. 2, 2004

Related U.S. Application Data

(63) Continuation of application No. PCT/GB02/03332, filed on Jul. 18, 2002.

(51) Int. Cl.$^7$ ............................................... G01R 19/00
(52) U.S. Cl. ........................................ 327/58; 327/160
(58) Field of Search ........................... 327/58, 62, 141, 327/160

(56) References Cited

U.S. PATENT DOCUMENTS 3,568,060 A    3/1971   Howells
3,851,257 A    11/1974  Boersma
4,074,358 A    2/1978   Caputo
4,783,342 A    11/1988  Polovina
5,052,026 A  * 9/1991   Walley ...................... 375/373
5,235,596 A    8/1993   Sporer
5,418,822 A    5/1995   Schlachter et al.

FOREIGN PATENT DOCUMENTS

EP      0 312 671       4/1989
FR      1 430 241       3/1966
WO      WO 99 44327     9/1999

* cited by examiner

Primary Examiner—Kenneth B. Wells
(74) Attorney, Agent, or Firm—Timothy J Keefer; SeyfarthShaw LLP

(57) ABSTRACT

A pulse detector has a leading edge detector and a trailing edge detector. A timing circuit is provided for determining the pulse duration between the leading edge and the trailing edge of a signal pulse; and a divider divides the pulse duration to produce a first timing pulse representative of a mid-point or peak of the signal pulse. An inverter may also be provided to produce a second timing pulse representative of troughs between signal pulses. A combiner may optionally be provided for combining the first and second timing pulses. The detector has application in signal cleaning circuits.

10 Claims, 1 Drawing Sheet

US 6,897,686 B2

PULSE PEAK AND/OR TROUGH DETECTOR

Figure 1:
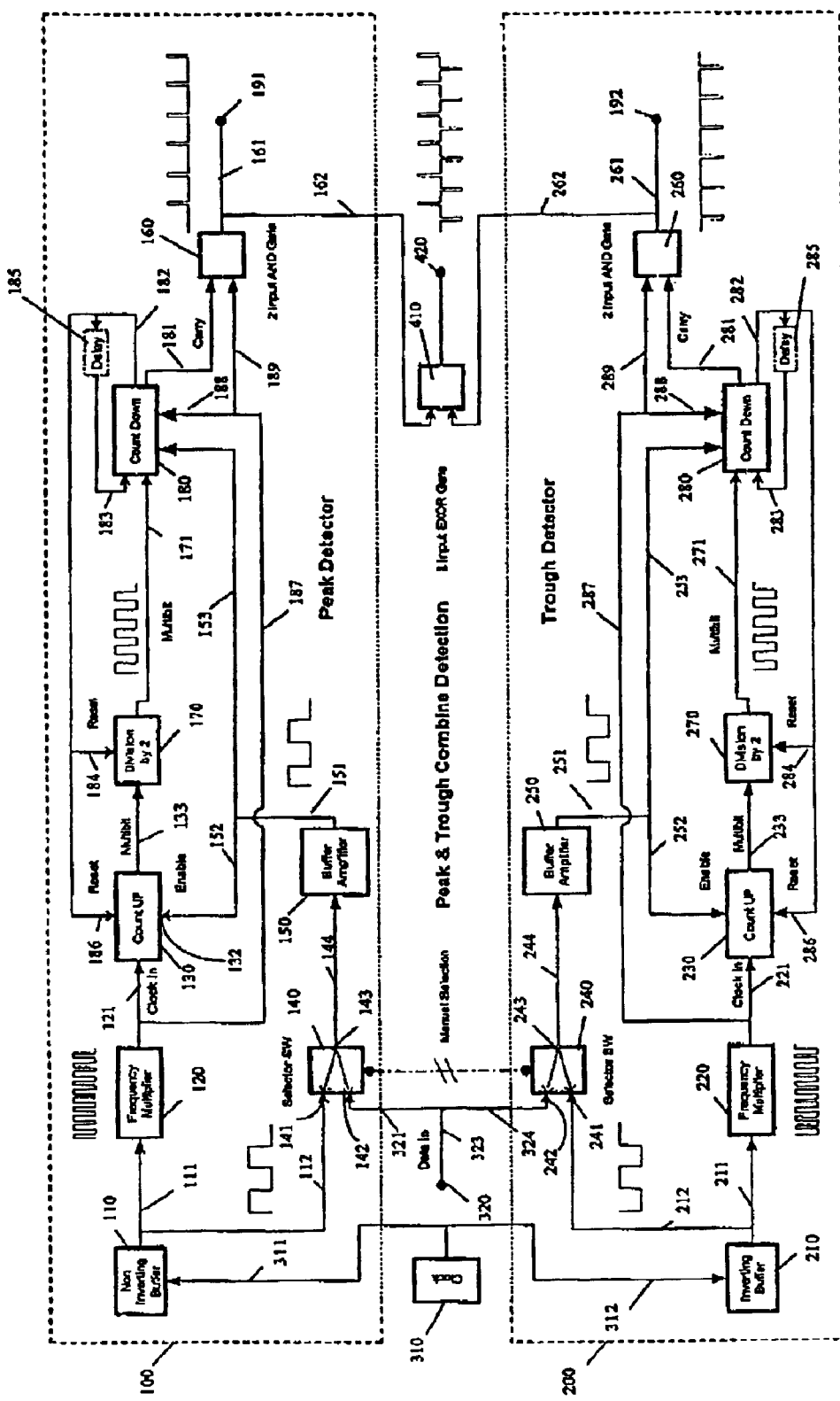

This is a continuation of appl. No. PCT/GB02/03332, filed Jul. 18, 2002.

The present invention relates to as a pulse peak and or trough detector.

A pulse peak and/or trough detector has application in the detection of peaks or troughs in clocking sources and for analogue or digital data systems. A particular application is in connection with the clock signal cleaning circuit of U.S. Pat. No. 6,246,276.

According to the present invention there is provided a pulse detector comprising: input means for inputting an input signal pulse; leading edge detector 10 means connected to the input means for detecting a leading edge of a first input signal pulse; trailing edge detector means connected to the input means for detecting a trailing edge of the first input signal pulse; first timing means, clocked by a clock signal, connected to the leading edge detector means and to the trailing edge detector means for determining a pulse duration time between detection of the leading edge 15 and detection of the trailing edge; divisor means connected to the timing means for dividing the pulse duration time to produce a divided pulse duration time; second timing means connected to the divisor means for outputting a pulse narrower than the input signal pulse the divided pulse duration time after detection of the leading edge of a second input pulse representative of a mid-point of the second input signal pulse;

and combining means connected to the second timing means and to the input means for combining the pulse narrower than the input signal pulse with the clock signal to provide an output pulse in synchronisation with the midpoint of the second input signal pulse.

Conveniently, the pulse detector further comprises pulse inverting means 25 connected to the input means for inverting at least two successive signal pulses to provide an output pulse corresponding to a mid-point of a trough between at least two successive signal pulses.

Preferably, the pulse detector comprises first leading edge detector means connected to the input means; first trailing edge detector means connected to the input means; first timing means connected to the first leading edge detector means and to the first trailing edge detector means for determining a first pulse duration time between detection of the leading edge and detection of the trailing edge of the signal pulse; and first divisor means connected to the first timing means for dividing the first pulse duration time for producing a first divided pulse duration time; second timing means connected to the divisor means for outputting a pulse narrower than the input signal pulse the divided pulse duration time after detection of the leading edge of a second input pulse representative of a mid-point of the second input signal pulse; and combining means connected to the second timing means and to the clock signal for combining the pulse narrower than the input signal pulse with the clock signal to provide an output pulse in synchronisation with the midpoint of the second input signal pulse; and second leading edge detector means connected to the pulse inverter means; second trailing edge detector means connected to the inverter means; third timing means connected to the second leading edge detector means and to the second trailing edge detector means for determining a second pulse duration time between detection of the leading edge and detection of the trailing edge of the inverted signal pulse; and second divisor means connected to the third timing means for dividing the second pulse duration time to produce a second divided pulse duration time; fourth. timing means connected to the divisor means for outputting a pulse narrower than the inverted signal pulse the second divided pulse duration time after detection of the leading edge of a second inverted pulse representative of a mid-point of the second inverted signal pulse; and combining means connected to the fourth timing means and to the clock signal for combining the pulse narrower than the input signal pulse with the clock signal to provide an output pulse in synchronisation with the midpoint of a trough between the at least two signal pulses.

Conveniently, the timing means comprises count-up means for producing a first count representative of the pulse duration time; the leading edged detector means and the trailing edge detector means comprise an enable port of the count-up means; the divisor means comprises arithmetic divider means for receiving a first count from the count-up means, halving the first count to produce a second count equal to half the first count and for transferring the second count to count-down means initiatable by reception at an enable port thereof of a second input pulse such that on completion of counting down through the second count the count-down means outputs the pulse narrower than the input signal pulse representative of the mid-point of the second input signal pulse.

Advantageously, the pulse detector further comprises clock means connected to frequency multiplier means which is connected to the count-up means and the count down means for synchronising the count-up means and the count-down means at a frequency higher than that of the clock means.

Preferably, the input means comprises switch means for switching input between the clock means and, a data input port.

Advantageously, the combining means is an AND gate electrically connected to the clock signal and to the count-down means for combining the clock signal with the pulse narrower than the input signal pulse output by the count-down means.

Preferably, buffer amplifier means are provided between the input means and the count-up means and the count-down means for preventing loading variations on the timing means and or to match a first propagation time of the signal pulse through the switching means and buffer amplifier means with a second propagation time of the signal pulse through the count-up means, the count-down means and the divisor means.

Advantageously, the pulse detector further comprises peak and trough combination means for combining the first output pulse and the second output pulse.

Preferably, the peak and trough combination means is an EXOR gate (410).

A specific embodiment of the invention will now be described by way of 20 example with reference to the accompanying drawing in which:

FIG. 1 is a schematic diagram of a detector according to the present invention.

The peak and trough detector illustrated in FIG. 1 comprises a peak detector 100 and a trough detector 200. Inputs of the peak detector and trough detector are provided by a clock 310 and a data signal port 320 which are both common to the peak detector 100 and the trough detector 200, Outputs of the peak detector 100 and trough detector 200 are both electrically connected to an optional EXOR gate 410 to provide a combined peak and trough output at an output port 420.

For the peak detector 100, an output of the common clock 310 is connected by a line 311 to a non-inverting buffer 110, Output from the buffer 110 is connected by a line 111 to an input of a first frequency multiplier 120. An output of the first frequency multiplier 120 is connected by a line 121 to a clock-in port of a first count 5 up digital counter 130.

The output from the buffer 110 is also connected by a line 112 to a first selector port 141 of a first selector switch 140. A second selector port 142 of the first selector switch 140 is connected by lines 321, 323 to the data signal port 320, so that the first selector switch 140 can be switched between input from the clock 310 and input from the data port 320.

An output 143 of the first selector switch 140 is connected by a line 144 to an input of a first buffer amplifier 150. An output of the first buffer amplifier 150 is connected by lines 1.51, 52 to an enable port 132 of the first count-up counter 130 and an enable port of a first count-down counter 180. The output of the frequency multiplier 120 is also connected by lines 187 and 189 to a first input port of a first two-input AND gate 160.

An output of the first count-up counter 130 is connected by a line 133 to an input of a first arithmetic divider 170. The line 133 can be serial or BCD format. An output of the first arithmetic divider 170 is connected by line 171 to an input of a first count-down counter 180. The line 170, also, can be serial or BCD format. An output of the first count-down counter 180 is connected by line 181 to a second input port of the first two-input AND gate 160.

The output of the first count-down counter 180 is also connected by line 182 to a first optional delay device 185 which is connected by line 183 to a reset input of the first count-down counter 180. The output of the first count-down counter 180 is also connected by lines 182 184 to a reset input of the first arithmetic divider 170 and by lines 182, 186 to a reset input of the first count-up counter 130.

The lines 187, 189 from the frequency multiplier 120 and the output line 181 from count-down counter 180 connected to the inputs of the AND gate 160 thus from a cycle for the peak detector 100. An output line 161 of the AND gate 160 forms the output of the peak detector 100 and is connected to a peak detector output port 191. The output of the first two-input AND gate 160, i.e., the output of the peak detector 100, is also connected by line 162 to a first input of the two-input EXOR gate 410 the output of which, as described above, is connected to the combined peak and trough output port 420.

Components of the trough detector 200 mirror those of the peak detector 100, except that the non-inverting buffer 110 of the peak detector is replaced by an inverting buffer 210 of the trough detector.

Thus, in the trough detector an output of the common clock 310 is connected by a line 312 to the inverting buffer 210. Output from the buffer 210 is connected by a line 211 to an input of a second frequency multiplier 220, An output of the second frequency multiplier 220 is connected by a line 221 to a clock-in port of a second count-up digital counter 230.

The output from the buffer 210 is also connected by a line 212 to a first selector port 241 of a second selector switch 240, A second selector port 242 of the second selector switch 240 is connected by lines 324, 323 to the data signal port 320, so that the second selector switch 240 can be switched between input from the clock 310 and input from the data port 320.

An output 243 of the second selector switch 240 is connected by a line 244 to an input of a second buffer amplifier 250. An output of the second buffer amplifier 250 is connected by lines 251, 252 to an enable port of the second count-up counter 230 and an enable port of the second count-down counter 280. The output of the second frequency multiplier is also connected by lines 287 and 289 to a first input port of a second two-input AND gate 260.

An output of the second count-up counter 230 is connected by line 233 to an input of a second arithmetic divider 270. An output of the second arithmetic divider 270 is connected by line 271 to an input of a second count-down counter 280. An output of the second count-down counter 280 is connected by line 281 to a second input port of the second two-input AND gate 260.

The output of the second count-down counter 280 is also connected by line 282 to a second optional delay device 285 which is connected by line 283 to a reset input of the second count-down counter 280. The output of the second count-down counter 280 is also connected by lines 282, 284 to a reset input of the second arithmetic divider 270 and by lines 282, 286 to a reset input of the second count-up counter 230.

An output of the second two-input AND gate 260 is connected by line 261 to a trough detector output port 192 The output of the second two-input AND gate 260 is also connected by line 262 to a second input of the two-input EXOR gate 410, the output of which, as described above, is connected to the combined peak and trough output port 420.

The first selector switch 140 is ganged to the second selector switch 240 so that inputs to the peak detector 100 and the trough detector 200 may be simultaneously switched, between input from the clock 310 and input from the data input 320.

The operation of the peak and trough detector will now be described.

Referring first to the peak detector 100, a clocking pulse output from the clock 310 to the non-inverting buffer 110, and output from the non-inverting buffer 110 to the first frequency multiplier 120 is output by the first frequency multiplier 120 at a higher frequency than the clock frequency to form the clock-in input of the first count-up counter 130 and the first count-down counter 180.

With the first selector switch 140 set to the first selector port 141 the clocking pulse output from the non-inverting buffer 110 is input through the first selector switch 140 into the first buffer amplifier 150. The primary function of the buffer amplifier is to avoid loading variations on the clock. As will become apparent, the buffer amplifier may also be used to match a first propagation time of the clocking pulse passed from the buffer amplifier 150 to the enable port of the first count-down counter 180 and a second propagation time of a pulse signal passed through the counters 130, 180 to the output gate 160.

The clocking pulse output from the first buffer amplifier 150 is input to the enable port of the first count-up counter 130. The enable port acts as an edge detector to detect a leading edge of a pulse of the clocking pulse and the counter 130 begins counting until a trailing edge of the pulse is detected when the counter 130 stops counting. The resultant count thus represents the duration of the pulse. This count number is output to the first arithmetic divider 170 where the count number is halved, thus representing half the duration of the pulse, and the new halved count number is output to the first count-down counter 180. The first count-down counter 180 begins counting down when enabled by an input pulse at the enable port thereof and stops on reaching zero when the counter 180 latches and the output of the counter goes High, which signal is input to the second input of the first two-input gate 160. Simultaneously, the clock pulse is fed from the first frequency multiplier to the first input of the first two-input AND gate 160. An output is produced from the first two-input AND gate 160 while both the inputs are 10 High, that is while the frequency multiplied clock pulse is being received and the timing pulse from the first count-down counter 160 is being received.

The output from the first count-down counter 180 may also be used to reset the counter 180. The width of the timing pulse is then determined by how quickly the counter 180 is reset. The time to reset the counter 180 can be adjusted by use of the first optional delay device 185 in the path from the counter output to the reset input. Normally, it is desirable to output as short a timing signal as possible in order to output as narrow a pulse as possible from the first two-input AND gate 160 to the peak detector output port 191 through the line 161. If it is required to output a wider timing pulse, which is still symmetrical about the midpoint of the signal pulse, it is necessary to perform a subtraction in the first arithmetic divider 170 after the division, so that the timing pulse starts earlier than without the subtraction and to add delay corresponding to the subtraction so that the timing pulse equally ends at a later time than it would without the delay.

Output from the first count-down counter 180 may also be used to reset the first arithmetic divider 170 and the first count-up counter 130 by means of the feedback lines 182 and 184 and 186 respectively.

If the first selector switch 140 is switched to receive input from the data input 320 rather than from the clock 310, then the peak detector can similarly be used to detect peaks in a data signal input at the data input 320.

The operation of the trough detector 200 is analogous to that of the peak detector 100. Because the input pulses are inverted in the trough detector 200 with respect to the pulses in the peak detector 100, then leading edges in the pulse detector correspond with trailing edges in the trough detector 200 and vice versa. Therefore, when a trailing edge detector formed by the enable port of the first count-up counter 130 detects a trailing edge, a leading edge detector formed by the enable port of the second count-up counter 230 detects a leading edge. The second count-up counter 230 therefore starts counting when the first count-up counter 130 stops counting and the second count-up counter 230 stops counting when the first count-up counter 130 starts counting. The person skilled in the art will therefore understand that it is possible to design the circuit such that only the leading edge counters are necessary, a first leading edge detector acting on the signal pulse starting the peak detector counter and stopping the trough detector counter and a second leading edge detector acting on the inverted signal pulse starting the second count-up counter and stopping the first count-up counter.

The output from the trough detector and from the peak detector may be combined by an optional two-input EXOR gate 410 to form a combined output at a combined peak and trough detector output port 420. It will be apparent that this arrangement allows the determination of peak-to-peak, trough-to-trough, peak-to-trough and trough-to-peak periods.

It will be understood that the detector of the invention may be used to determine the exact mid-point of any pulse, whether digital or analogue, and whether synchronous or asynchronous.

It will be further understood that instead of edge detectors and counters, priority encoders may be used, where high accuracy or precision is needed. Where there are a number of majority encoders in a circuit that all share the same outputs, but only one device can be active at a time to avoid conflicts, then a priority must be assigned to each device. The device with the highest priority is given access to the outputs if that device is active. If the highest priority device is not active, then the next lowest priority device can use the outputs, and so on. With a priority encoder, the device follows similar rules (although the outputs are NOT shared). A device can be defined as being active if its outputs are anything other than 00. A 6-input priority encoder will have a circuit with two majority encoders, for a 9-input priority encoder, the circuit will have three encoders, and so on.

What is claimed is:

1. A pulse detector comprising: input means for inputting an input signal pulse; leading edge detector means connected to the input means for detecting a leading edge of a first input signal pulse; trailing edge detector means connected to the input means for detecting a trailing edge of the first input signal pulse; first timing means, clocked by a clock signal, connected to the leading edge detector means and to the trailing edge detector means for determining a pulse duration time between detection of the leading edge and detection of the trailing edge; divisor means connected to the timing means for dividing the pulse duration time to produce a divided pulse duration time; second timing means connected to the divisor means for outputting a pulse narrower than the input signal pulse the divided pulse duration time after detection of the leading edge of a second input pulse representative of a mid-point of the second input signal pulse; and combining means connected to the second timing means and to the input means for combining the pulse narrower than the input signal pulse with the clock signal to provide an output pulse in synchronisation with the midpoint of the second input signal pulse.

2. A pulse detector as claimed in claim 1, further comprising pulse inverting means connected to the input means for inverting at least two successive signal pulses to provide an output pulse corresponding to a mid-point of a trough between at least two successive signal pulses.

3. A pulse detector as claimed in claim 2, comprising first leading edge detector means connected to the input means; first trailing edge detector means connected to the input means; first timing means connected to the first leading edge detector means and to the first trailing edge detector means for determining a first pulse duration time between detection of the leading edge and detection of the trailing edge of the signal pulse; and first divisor means connected to the first timing means for dividing the first pulse duration time for producing a first divided pulse duration time; second timing means connected to the divisor means for outputting a pulse narrower than the input signal pulse the divided pulse duration time after detection of the leading edge of a second input pulse representative of a mid-point of the second input signal pulse; and combining means connected to the second timing means and to the clock signal for combining the pulse narrower than the input signal pulse with the clock signal to provide an output pulse in synchronisation with the midpoint of the second input signal pulse; and second leading edge detector means connected to the pulse inverter means; second trailing edge detector means connected to the inverter means; third timing means connected to the second leading edge detector means and to the second trailing edge detector means for determining a second pulse duration time between detection of the leading edge and detection of the trailing edge of the inverted signal pulse; and second divisor means connected to the third timing means for dividing the second pulse duration time to produce a second divided pulse duration time; fourth timing means connected to the divisor means for outputting a pulse narrower than the inverted signal pulse the second divided pulse duration time after detection of the leading edge of a second inverted pulse representative of a mid-point of the second. inverted signal pulse; and combining means connected to the fourth timing means and to the clock signal for combining the pulse narrower than the input signal pulse with the clock signal to provide an output pulse in synchronisation with the midpoint of a trough between the at least two signal pulses.

4. A pulse detector as claimed in claim 1, wherein the timing means comprises count-up means for producing a first count representative of the pulse duration time; the leading edged detector means and the trailing edge detector means comprise an enable port of the count-up means; the divisor means comprises arithmetic divider means for receiving a first count from the count-up means, halving the first count to produce a second count equal to half the first count and for transferring the second count to count-down means initiatable by reception at an enable port thereof of a second input pulse such that on completion of counting down through the second count the count-down means outputs the pulse narrower than the input signal pulse representative of the mid-point of the second input signal pulse.

5. A pulse detector as claimed in claim 4, further comprising clock means connected to frequency multiplier means which is connected to the count-up means and the count-down means for synchronising the count-up means and the count-down means at a frequency higher than that of the clock means.

6. A pulse detector as claimed in claim 1 wherein the input means comprises switch means for switching input between the clock means and a data input port.

7. A pulse detector as claimed in claims 4 to 6, wherein the combining means is an AND gate electrically connected to the clock signal and to the count-down means for combining the clock signal with the pulse narrower than the input signal pulse output by the count-down means.

8. A pulse detector as claimed in claim 7, wherein buffer amplifier means are provided between the input means and the count-up means and the count-down means for preventing loading variations on the timing means and/or to match a first propagation time of the signal pulse through the switching means and buffer amplifier means with a second propagation time of the signal pulse through the count-up means, the count-down means and the divisor means.

9. A pulse detector as claimed in claim 3, further comprising peak and trough combination means for combining the first output pulse and the second output pulse.

10. A pulse detector as claimed in claim 9, wherein the peak and trough combination means is an EXOR gate.

* * * * *